United States Patent [19]

Kadota et al.

[11] Patent Number: 5,767,603
[45] Date of Patent: Jun. 16, 1998

[54] PIEZOELECTRIC RESONATORS FOR TRAP CIRCUITS HAVING A PLURALITY OF TRAP FREQUENCIES

[75] Inventors: Michio Kadota; Junya Ago, both of Kyoto; Kazuhiko Morozumi, Ishikawa, all of Japan

[73] Assignee: Murata Manufacturing Co., Ltd., Japan

[21] Appl. No.: 746,150

[22] Filed: Nov. 6, 1996

Related U.S. Application Data

[63] Continuation of Ser. No. 385,847, Feb. 9, 1995, abandoned.

[30] Foreign Application Priority Data

Mar. 4, 1994 [JP] Japan .................. 6-034415
Apr. 5, 1994 [JP] Japan .................. 6-067427

[51] Int. Cl.$^6$ .................. H03H 9/25
[52] U.S. Cl. .................. 310/313 B; 310/313 D; 310/313 R
[58] Field of Search .................. 310/313 R, 313 B, 310/313 D, 316, 317, 320, 366

[56] References Cited

U.S. PATENT DOCUMENTS

| | | | |
|---|---|---|---|
| 3,581,248 | 5/1971 | De Vries et al. | 333/30 |
| 3,678,305 | 7/1972 | Paige | 310/313 R |
| 4,006,290 | 2/1977 | Momberger et al. | 358/196 |
| 4,066,985 | 1/1978 | Kuny | 310/313 R |
| 4,162,465 | 7/1979 | Hunsinger et al. | 333/151 |
| 4,206,380 | 6/1980 | Hazama et al. | 310/313 R |
| 4,308,510 | 12/1981 | Yamada et al. | 333/194 |
| 4,357,553 | 11/1982 | Minagawa et al. | 310/313 B |
| 4,384,264 | 5/1983 | Kadota | 333/193 |
| 4,422,000 | 12/1983 | Yamada et al. | 310/313 D |
| 4,453,242 | 6/1984 | Toda | 369/132 |
| 5,077,545 | 12/1991 | Gopani et al. | 310/313 D |
| 5,184,042 | 2/1993 | Kadota et al. | 310/313 A |
| 5,220,234 | 6/1993 | Flory et al. | 310/313 D |
| 5,260,913 | 11/1993 | Kadota et al. | 310/313 R |
| 5,345,135 | 9/1994 | Peach | 310/313 B |
| 5,432,392 | 7/1995 | Kadota et al. | 310/313 A |

FOREIGN PATENT DOCUMENTS

| | | | |
|---|---|---|---|
| 5145369 | 6/1993 | Japan | 310/313 A |
| 5291869 | 11/1993 | Japan | 310/313 B |
| 2000409 | 4/1977 | United Kingdom | H03H 9/14 |
| 2030407 | 9/1978 | United Kingdom | H03H 9/64 |
| 2009546 | 10/1978 | United Kingdom | H04H 5/44 |
| 2000409 | 1/1979 | United Kingdom | 310/313 R |
| 2244880 | 5/1990 | United Kingdom | H03H 9/02 |
| 92385966 | of 0000 | WIPO | |

OTHER PUBLICATIONS

"Resonators Utilizing Reflection of the Piezoelectric Surface Shear Wave at Edge Surfaces" by H. Shimizu, K. Nakamura and K. Iwahashi, Collection of Speeches and Articles, p. 351, Japan Acoustics Soc. (May, 1976).

"Some Studies on SAW Resonators and Multiple-Mode Filters" by Y. Suzuki, et al., pp. 297-302; 1976 Ultrasonics Symposium Proceedings (1976).

*Primary Examiner*—Thomas M. Dougherty
*Attorney, Agent, or Firm*—Majestic, Parsons, Siebert & Hsue

[57] ABSTRACT

A single-chip piezoelectric resonator using SH type surface waves has an interdigital transducer formed on a piezoelectric substrate. The interdigital transducer is designed to have two or more resonance characteristics, for example, by using a pair of thinned-out comb-shaped electrodes with mutually interlocking fingers protruding towards each other. Such an interdigital transducer may be formed also by using a pair of comb-shaped electrodes with the lengths of their mutually pointing fingers varied. A trap circuit with two sufficiently separated trap frequencies and improved attenuation characteristics at these two trap frequencies can be formed by forming two interdigital transducers of the kind described above on a single piezoelectric substrate so as to provide two resonant units each having two resonance characteristics. Alternatively, two piezoelectric resonators of the kind described above may be connected in parallel to provide two resonance characteristics. The attenuation characteristics can be further improved by inserting an inductor connected between the interdigital transducers and/or another inductor between a signal receiving terminal on one of the interdigital transducers and an input terminal through which signal are received by the trap circuit.

6 Claims, 9 Drawing Sheets

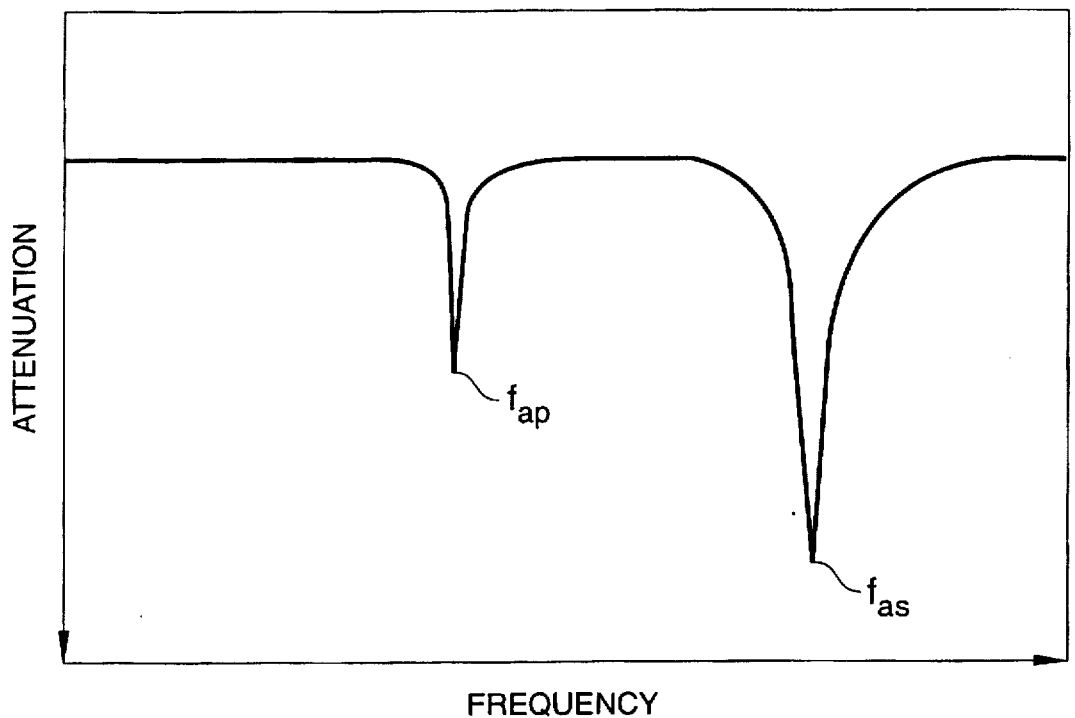
FIG._1
(PRIOR ART)
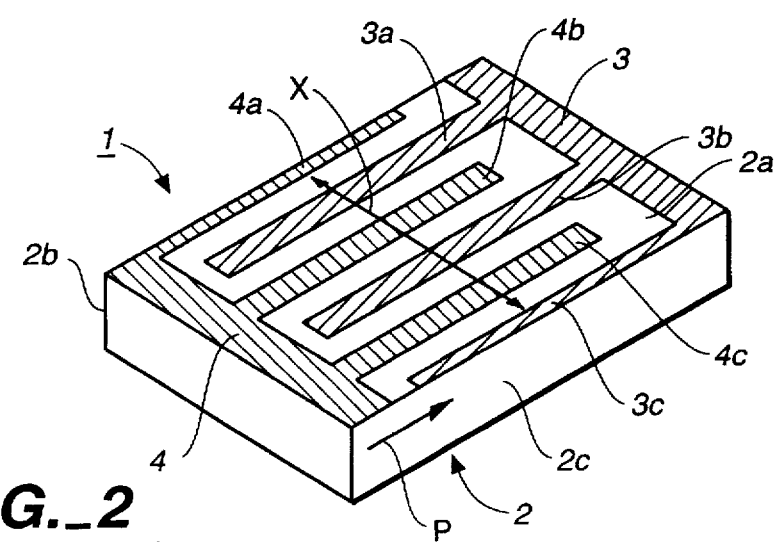
FIG._2
(PRIOR ART)

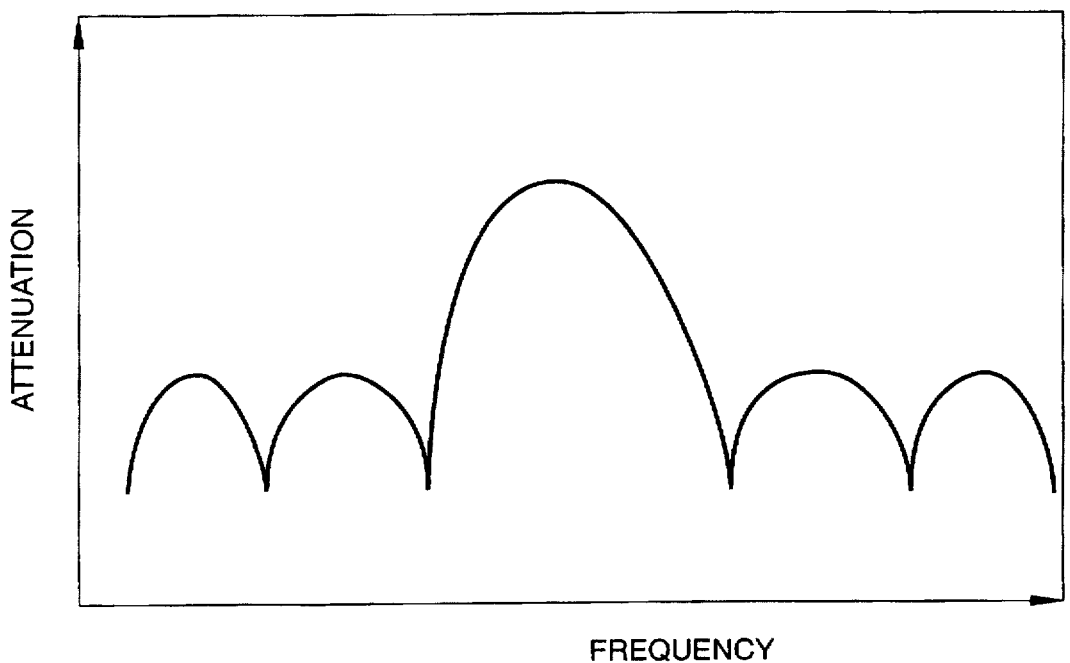
FIG._3A
*(PRIOR ART)*
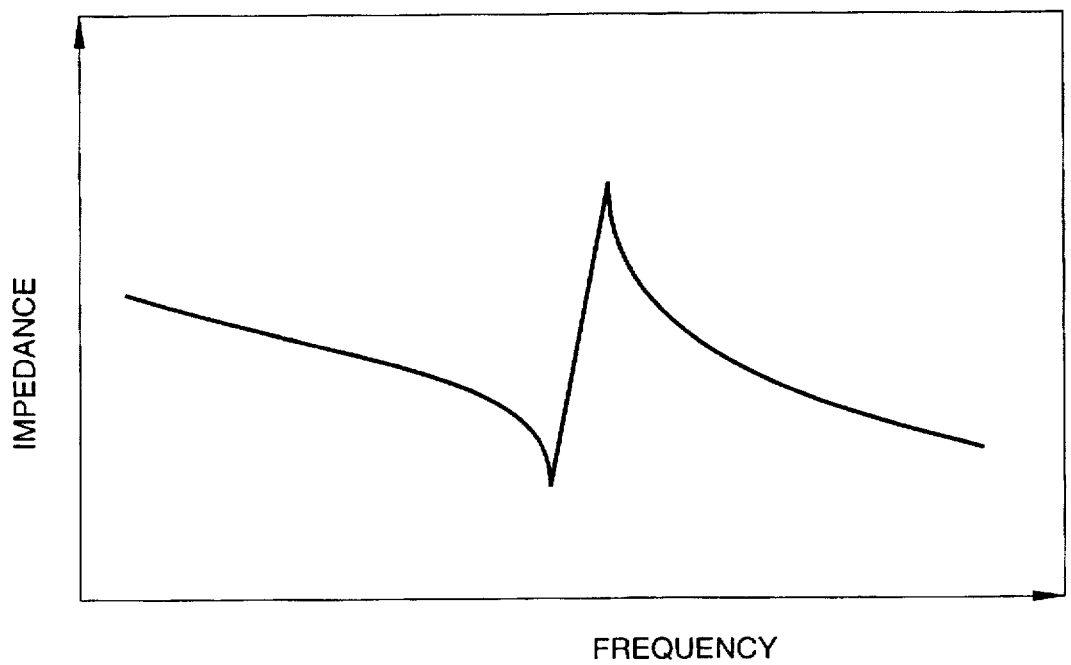
FIG._3B
*(PRIOR ART)*

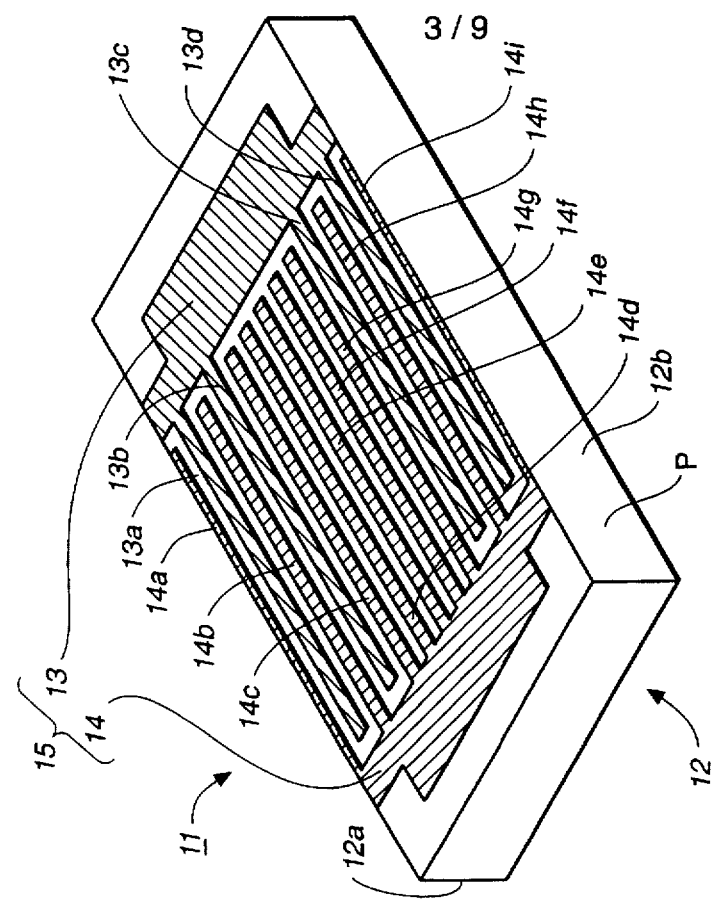
FIG._5
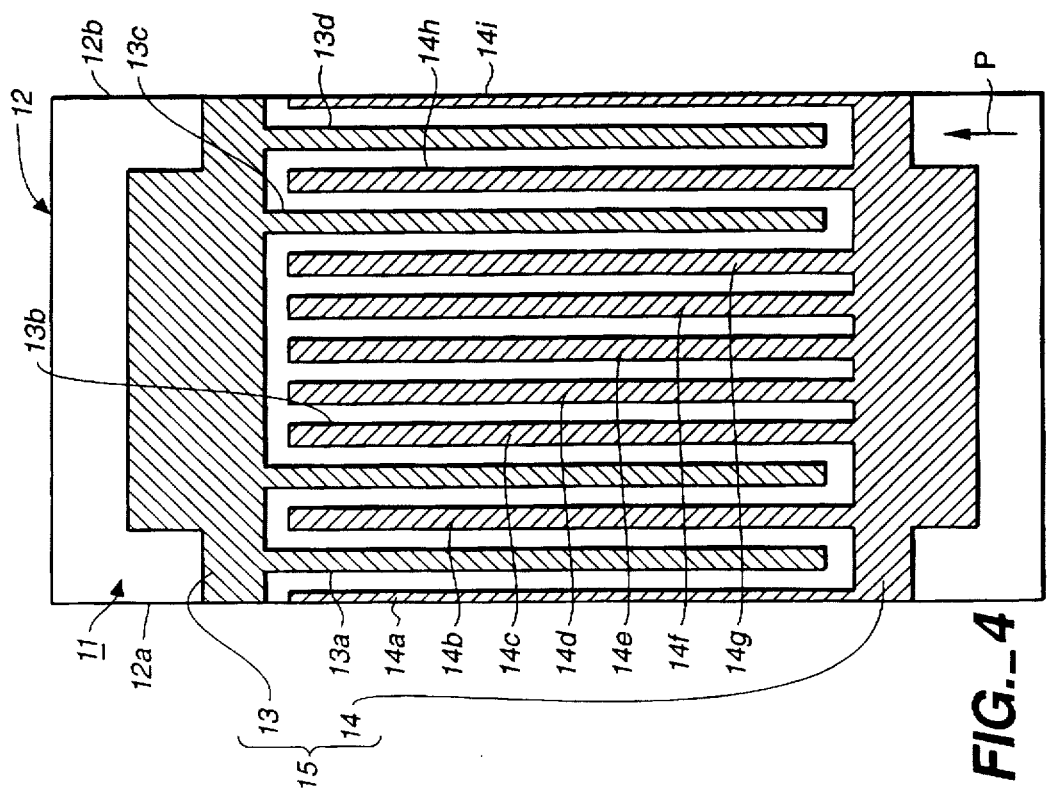
FIG._4

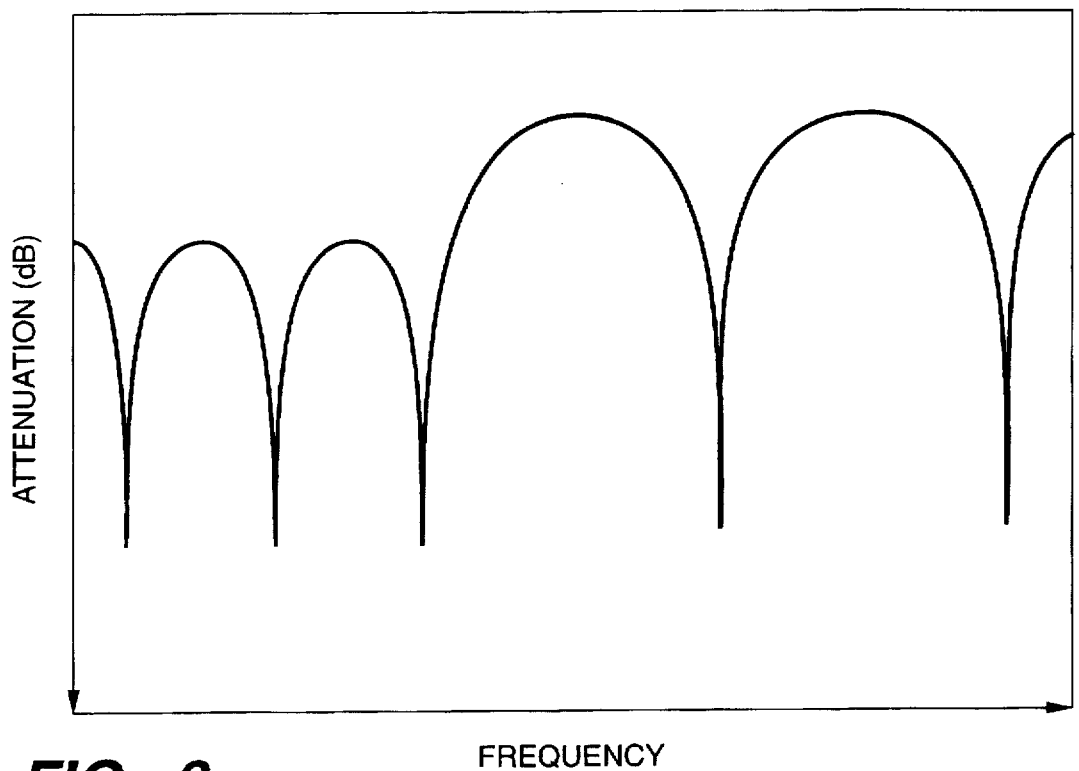
FIG._6
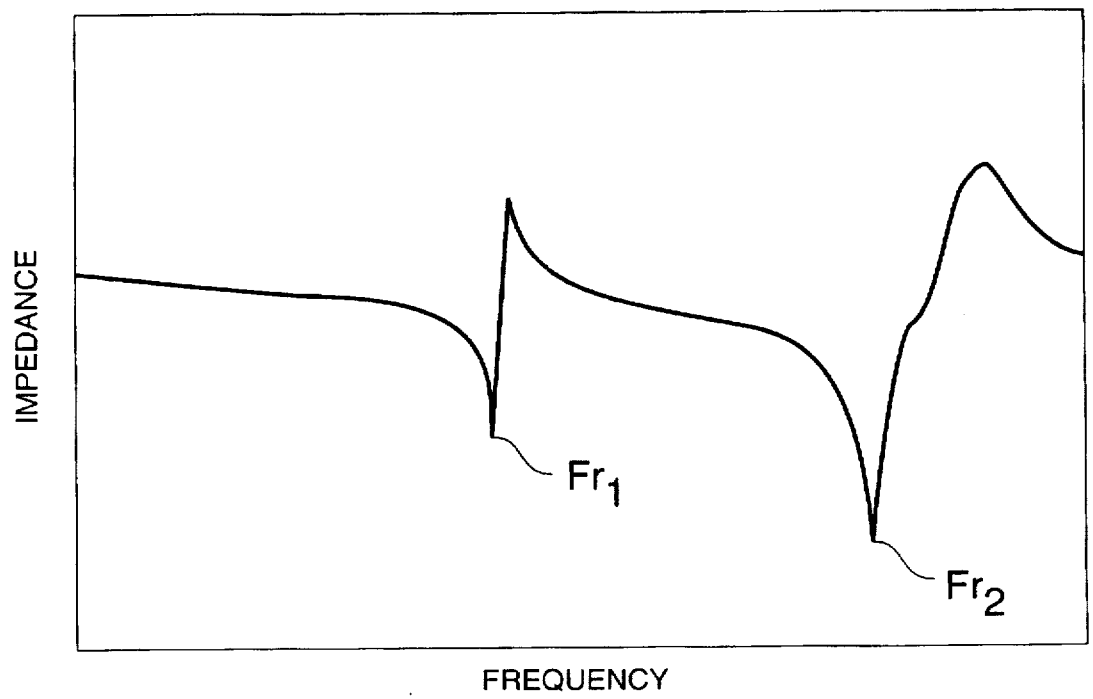
FIG._7

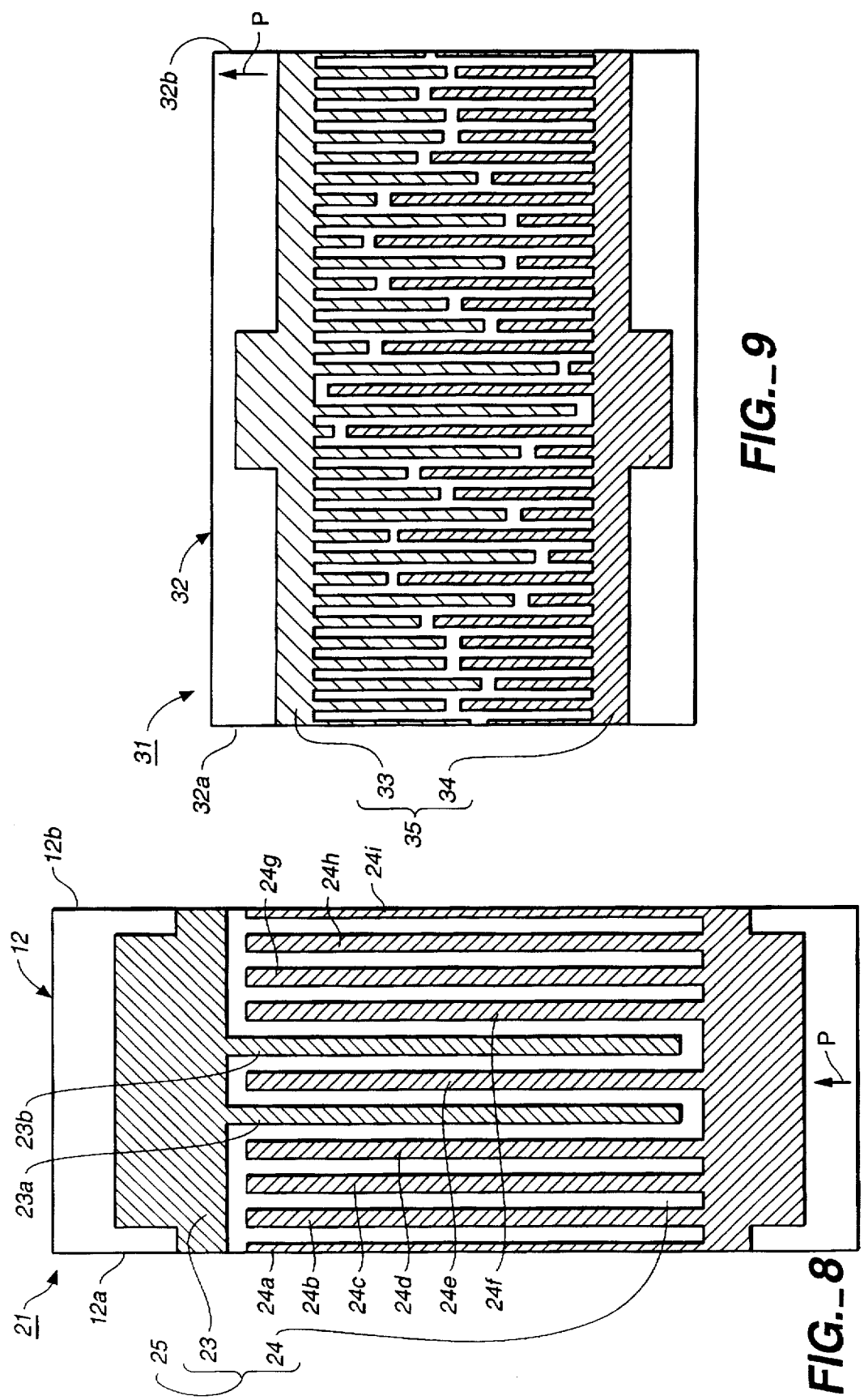

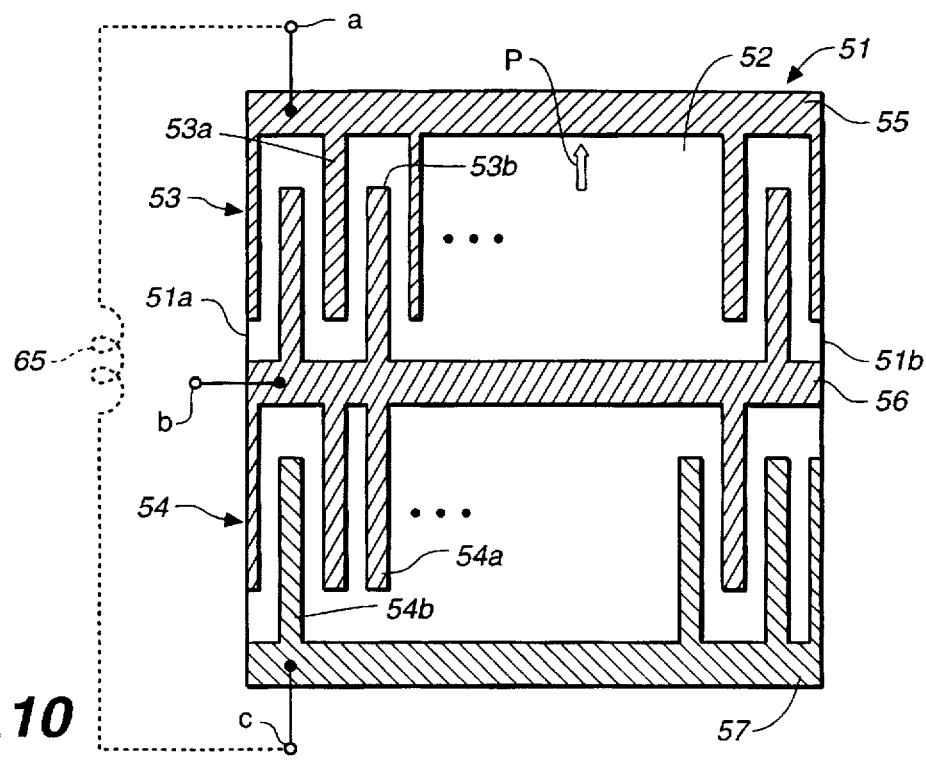
FIG._10
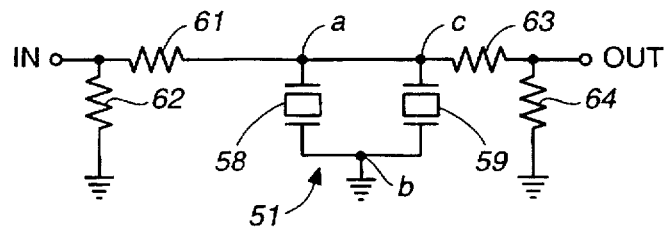
FIG._11
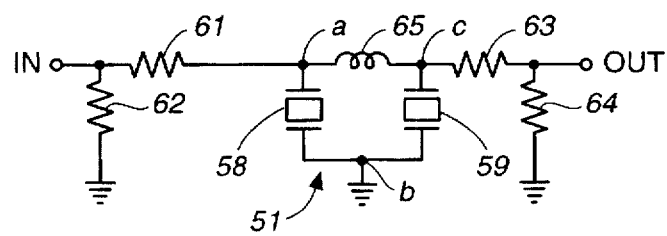
FIG._13
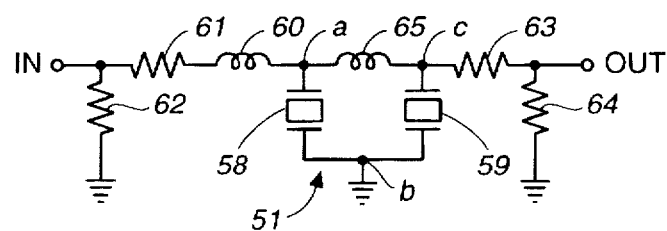
FIG._15

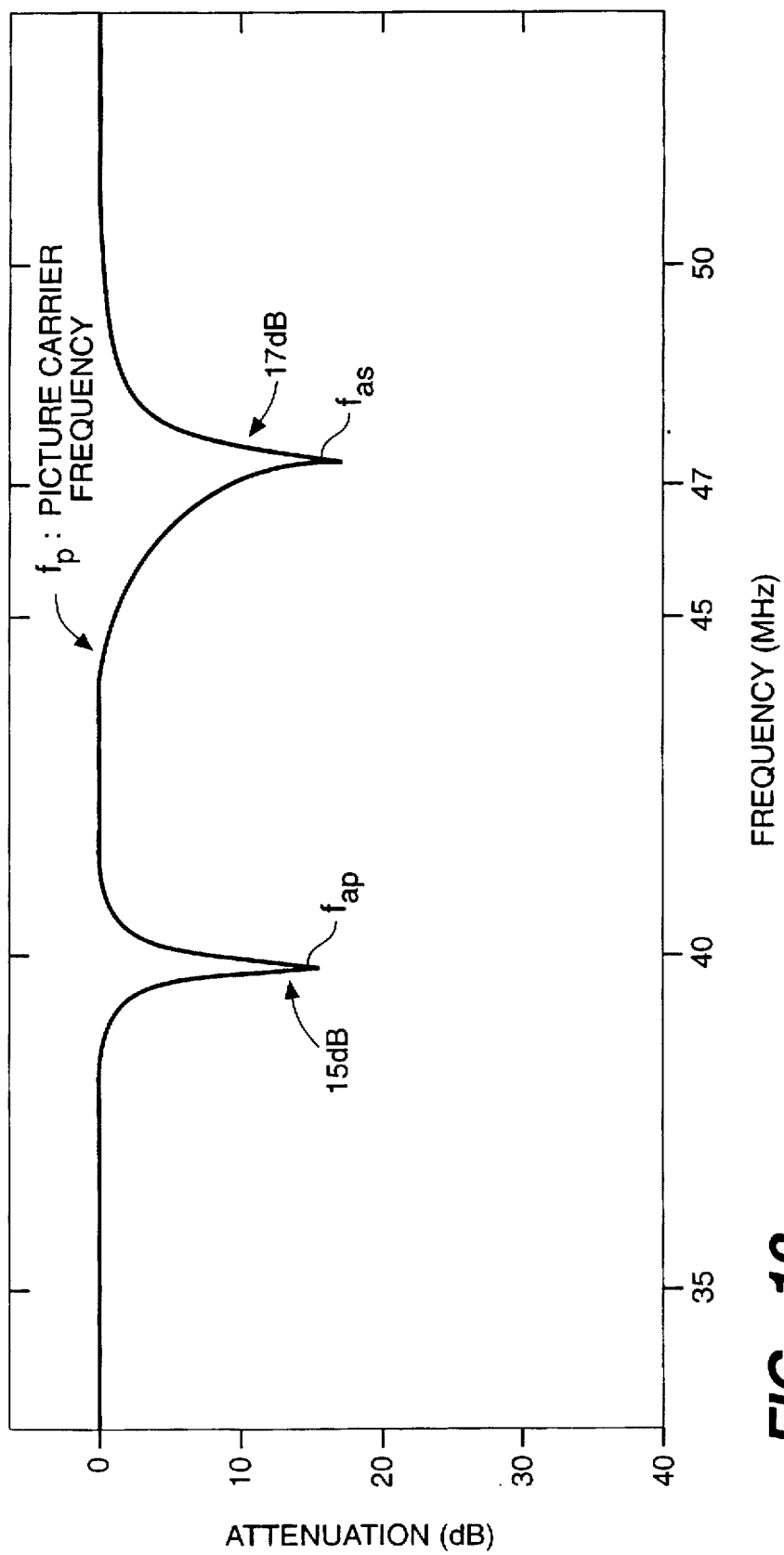
FIG._12

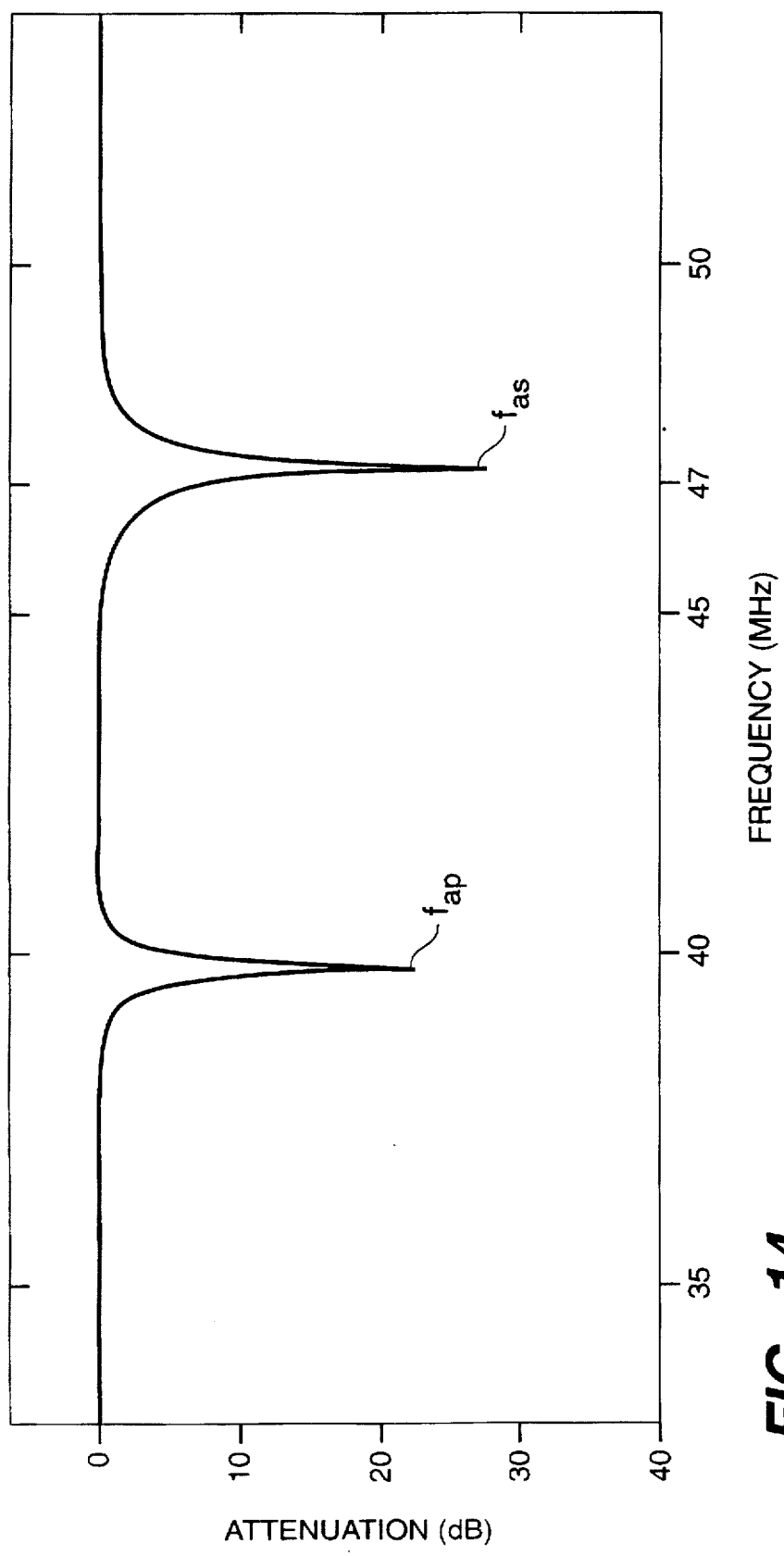
FIG._14

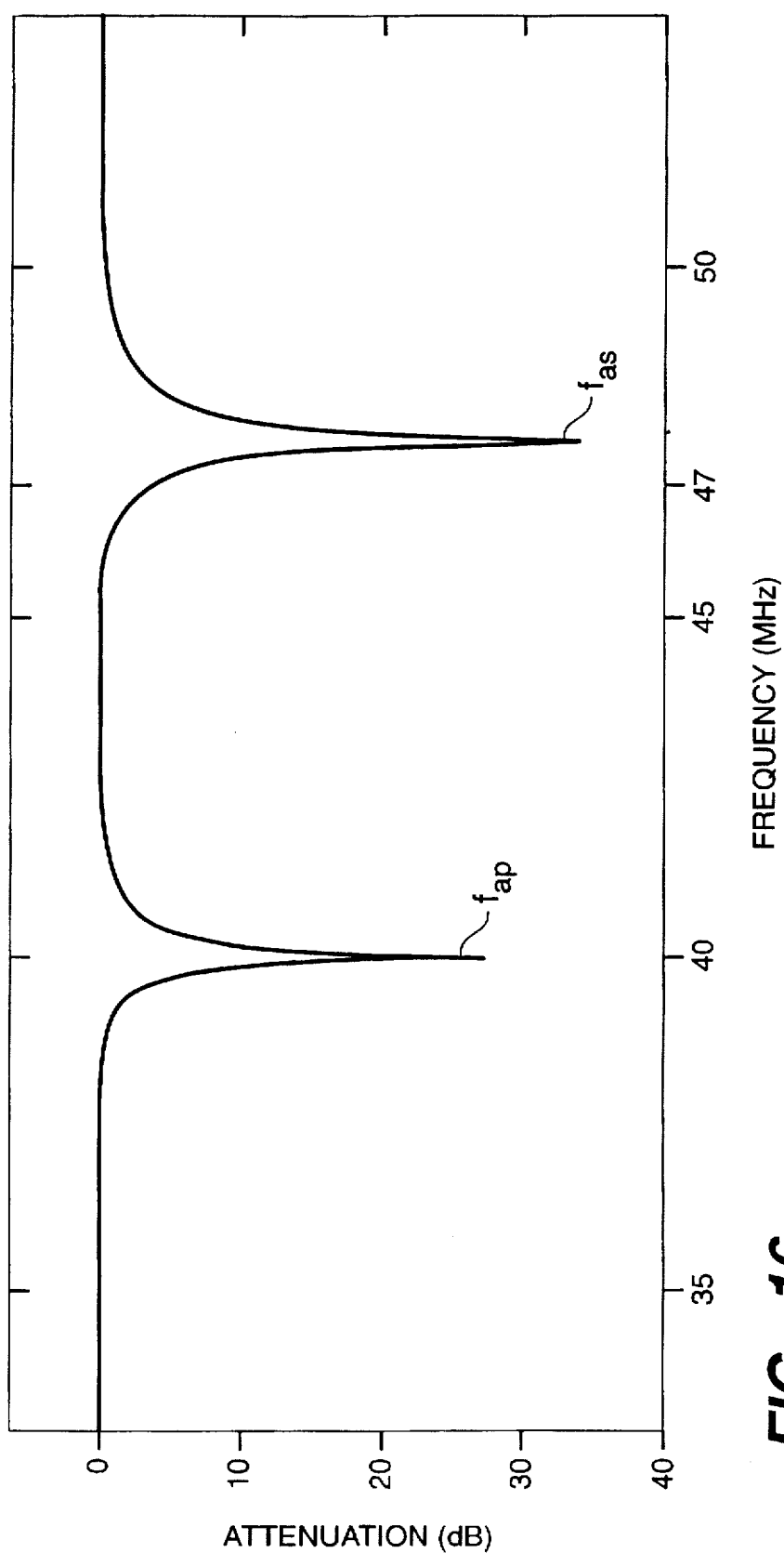
FIG._16

PIEZOELECTRIC RESONATORS FOR TRAP CIRCUITS HAVING A PLURALITY OF TRAP FREQUENCIES

This is a continuation of application Ser. No. 08/385,847 filed Feb. 9, 1995, now abandoned.

BACKGROUND OF THE INVENTION

This invention relates to piezoelectric resonators using SH type surface waves and more particularly to such piezoelectric resonators having a plurality of resonant characteristics. This invention also relates to trap circuits comprising such piezoelectric resonators using SH type surface waves and more particularly to such trap circuits having not only a plurality of trap frequencies but also improved attenuation characteristics.

Trap circuits with characteristic as shown in FIG. 1 are used for the intermediate picture frequency section in television video receivers and video tape recorders in order to prevent beats due to interference between adjacent channels. In other words, signals must be sufficiently attenuated at the adjacent-channel picture carrier frequency $f_{ap}$ and the adjacent-channel sound carrier frequency $f_{as}$ (respectively 39.75 MHz and 47.25 MHz according to the National Television System Committee (NTSC) of the United States).

In order to obtain such a trap characteristic, it has been customary to make use of two traps, one having an attenuation pole at the adjacent-channel picture carrier frequency $f_{ap}$ and the other having an attenuation pole at the adjacent-channel sound carrier frequency $f_{as}$, each trap being formed with an LC resonant circuit or a piezoelectric resonator. As piezoelectric resonators to be used for such a purpose, attention is coming to be focused on those which make use of SH-type surface waves such as the BGS (Bleustein-Gulyaev-Shimizu) wave. FIG. 2 shows a BGS wave resonator 1 utilizing the free-edge surface reflection, comprised of a piezoelectric substrate 2 of a piezoelectric material such as piezoelectric ceramics like lead zirconate titanate or piezoelectric single crystals of LiNbO$_3$ or LiTaO$_3$, having a quadrangular planar shape. If it is made of a piezoelectric ceramic material, it is polarized in the direction of arrow P. A pair of comb-shaped electrodes 3 and 4, each having a plurality of fingers 3a–3c and 4a–4c protruding interdigitatingly toward each other, is formed on the upper surface 2a of the piezoelectric substrate 2 to serve as an interdigital transducer.

With the BGS wave resonator utilizing the free-edge surface reflection type thus structured, BGS waves are excited if an AC voltage is applied to the comb-shaped electrodes 3 and 4. The BGS waves are propagated in the direction shown by arrow X and is reflected by the end surfaces of the piezoelectric substrate 2. If the frequency spectrum determined by this interdigital transducer and the frequency determined by the dimension between the end surfaces are matched, a useful resonant characteristic can be obtained from the surface wave resonator 1. FIG. 3A shows the attenuation-frequency characteristic of this end surface reflection type surface wave resonator, and FIG. 3B shows its impedance-frequency characteristic. FIGS. 3A and 3B clearly show that the end surface reflection type surface wave resonator shown in FIG. 2, like the prior art LC resonance circuits and other kinds of piezoelectric resonators, has a single resonance characteristic.

As a result, it has been necessary to provide and connect two resonance circuits or piezoelectric resonators to obtain a trap characteristic as shown in FIG. 1, but the attenuation was not sufficient at each trap frequency even if two resonance circuits or piezoelectric resonators were connected together.

Single surface acoustic wave resonators making use of the Rayleigh wave and having two resonance characteristics have been known. For example, Kanda, et al (Kokusai Denki Giho, No. 16, pages 1–7 (1992)) disclosed a surface wave resonant filter making use of the Rayleigh wave serving as a double-mode resonator making use of the zeroth-order longitudinal mode (the fundamental mode) and the second-order longitudinal mode. In order to obtain two resonance characteristics, however, this double-mode resonator required more than two interdigital transducers and a reflector. Its resonance characteristics are determined by the reflectivity-frequency characteristic of the reflector but since the reflectivity is large only in a small frequency range, the distance between the two resonant frequencies was as small as about 1 MHz. In other words, a trap filter with characteristic as shown in FIG. 1 cannot be formed with such a double-mode resonator alone.

SUMMARY OF THE INVENTION

It is therefore an object of this invention to provide a piezoelectric resonator using SH type surface waves, capable of providing a plurality of attenuation poles by means of a single chip.

It is another object of this invention to provide a trap circuit capable of providing sufficiently large attenuation at a plurality of trap frequencies.

A piezoelectric resonator of the kind using SH type surface waves, which embodies the present invention and with which the above and other objects can be achieved, may be characterized as comprising a piezoelectric substrate and an interdigital transducer which is formed thereon and has at least two resonance characteristics. Such an interdigital transducer may comprise a pair of thinned-out comb-shaped electrodes with finger-shaped portions protruding interlockingly towards each other, or a pair of comb-shaped electrodes with the lengths of their fingers varying such that the lengths of the regions between the fingers, where surface waves can be excited, will vary. Piezoelectric resonators thus structured according to this invention have two resonance characteristics with the resonant frequencies separated by as much as about 8 MHz. This is either because resonators can be designed such that the main lobe frequency determined by the interdigital transducer and the frequency determined by the separation between the end surfaces are separated farther or because a plurality of main lobes can be designed. Because the present invention makes it possible to provide a plurality of trap frequencies as shown in FIG. 1 by means of a single chip, the number of components and the cost of assembling these components can both be reduced.

A trap circuit embodying the present invention may be characterized as being formed with a piezoelectric resonator using SH type surface waves and comprising a piezoelectric substrate and two mutually connected interdigital transducers serving as two parallel-connected resonant units having two resonance characteristics. In other words, only a single piezoelectric resonator is required according to this invention to form a trap circuit with two trap frequencies. When such a trap circuit is connected between an input terminal and an output terminal, an inductor may be inserted between these two resonant units and/or between the input terminal and where the two resonant units are connected together in order to obtain more attenuation at adjacent-channel picture and sound carrier frequencies.

3

Alternatively, two piezoelectric resonators according to this invention may be used to provide two trap frequencies.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is an attenuation-frequency characteristic of a trap circuit having two traps;

FIG. 2 is diagonal view of a prior art BGS wave resonator utilizing the free-edge surface reflection;

FIGS. 3a and 3b are graphs showing the attenuation-frequency and the impedance-frequency characteristics of the surface wave resonator shown in FIG. 2;

FIG. 4 is a plan view of a piezoelectric resonator according to a first embodiment of this invention;

FIG. 5 is a diagonal view of the piezoelectric resonator shown in FIG. 4;

FIG. 6 is a graph of the attenuation-frequency characteristic of the piezoelectric resonator shown in FIGS. 4 and 5;

FIG. 7 is a graph of the impedance-frequency characteristic of the piezoelectric resonator shown in FIGS. 4 and 5;

FIG. 8 is a plan view of a piezoelectric resonator according to a second embodiment of this invention;

FIG. 9 is a plan view of a piezoelectric resonator according to a third embodiment of this invention;

FIG. 10 is a plan view of a piezoelectric resonator according to a fourth embodiment of the invention for forming a trap circuit with improved attenuation;

FIG. 11 is a circuit diagram of a trap circuit using a piezoelectric resonator shown in FIG. 10;

FIG. 12 is a graph showing the attenuation-frequency characteristic of the trap circuit shown in FIG. 11;

FIG. 13 is a circuit diagram of another trap circuit using a piezoelectric resonator shown in FIG. 10;

FIG. 14 is a graph showing the attenuation-frequency characteristic of the trap circuit shown in FIG. 13;

FIG. 15 is a circuit diagram of still another trap circuit using a piezoelectric resonator shown in FIG. 10; and FIG. 16 is a graph showing the attenuation-frequency characteristic of the trap circuit shown in FIG. 15.

Throughout herein, components which are substantially the same or at least equivalent to each other are indicated by the same numerals and not described repetitiously.

DETAILED DESCRIPTION OF THE INVENTION

In what follows, the invention will be described by way of examples but these examples are not intended to limit the scope of the invention.

FIGS. 4 and 5 show a piezoelectric resonator 11 according to a first embodiment of this invention, comprising a piezoelectric substrate 12 having a rectangular plane and made of an appropriate piezoelectric material such as piezoelectric ceramics like lead zirconate titanate. The piezoelectric substrate 12 is subjected to a polarization process in the direction shown by arrow P, parallel to its main surface and also to the direction in which electrode fingers, to be explained below, are extended.

An interdigital transducer (hereinafter abbreviated as IDT) 15 comprising a pair of mutually interlocking thinned-out comb-shaped electrodes 13 and 14 is formed on the upper surface of the piezoelectric substrate 12. The comb-shaped electrodes 13 and 14 respectively have a plurality of electrode fingers 13a–13d and 14a–14i opposite to and in the direction of P. It is to be noted in FIGS. 4 and 5 that, although these electrode fingers 13a–13d and 14a–14i are in a mutually interlocking formation, those 13a–13d extending from one of the electrodes (13) and those 14a–14i extending from the other (14) are not designed to appear alternately as one moves transversely to the direction of extension of the fingers. In other words, the IDT 15 may be described as being formed by thinning out (or removing) some of the fingers from two regular comb-shaped electrodes interlocked with each other such that the fingers extending therefrom are originally arranged alternately.

Described more in detail, the electrode 13 as shown in FIGS. 4 and 5 may be considered to have its fingers thinned out between the fingers 14c and 14g. Of the regions between two mutually adjacent fingers, let "1" denote those between two fingers adapted to be connected to different voltages and "0" denote those between two fingers adapted to be connected to the same voltage. In other words, when different voltages are applied to the two comb-shaped electrodes 13 and 14, Regions 1 are where BGS waves are excited and Regions 0 are where BGS waves are not excited. The twelve regions between the fingers 14a and 14i of the piezoelectric resonator 11 are denoted sequentially as 1, 1, 1, 1, 0, 0, 0, 0, 1, 1, 1, 1.

The fingers 13a–13d and 14a–14i are so designed that each region between a mutually adjacent pair of fingers has the same width equal to one quarter of the wavelength λ of the BGS wave to be excited, that the width of every finger except the outermost fingers 14a and 14i is also λ/4, and that the width of the outermost fingers 14a and 14i is λ/8. The outermost fingers 14a and 14i are formed on the edges of the upper surface and mutually opposite side end surfaces 12a and 12b of the piezoelectric substrate 12. Comb-shaped electrodes as described above can be produced, for example, by forming many fingers of width λ/4 at a pitch of also λ/4 on a piezoelectric substrate which is wider than the required piezoelectric substrate 12 and dicing the piezoelectric substrate such that the width of the outermost electrodes 14a and 14i will be halved.

The piezoelectric resonator 11, as described above, excites BGS waves propagating perpendicularly to the direction of extension of the fingers 13a–13d and 14a –14i of its comb-shaped electrodes 13 and 14 when an AC voltage is applied to it through the electrodes 13 and 14. These BGS waves are reflected between the edge surfaces 12a and 12b. In other words, the piezoelectric resonator 11 is a surface wave resonator of an end surface reflection type using BGS waves, like the prior art resonator 1 shown in FIG. 2. Its attenuation-frequency characteristic and impedance-frequency characteristic are shown in FIGS. 6 and 7, respectively. FIGS. 6 and 7 clearly show that the piezoelectric resonator 11 has two resonant frequencies $f_{r1}$ and $f_{r2}$, that is, it has two resonance characteristics. It is because the IDT 15 is formed with thinned-out electrodes. In other words, two main lobes can be provided, determined by such an IDT 15.

According to a preferred embodiment of this invention, the frequency difference between the two resonant frequencies $f_{r1}$ and $f_{r2}$ is about 8 MHz. In other words, this invention makes it possible to obtain two resonance characteristics with a much larger frequency difference than in the case of double-mode resonator filters using the Rayleigh wave, as described above. This is probably because two main lobes of the frequency spectrum determined by the IDT could be provided. Accordingly, the present invention makes it possible to provide piezoelectric resonators with two resonant frequencies with a relatively large appropriate frequency difference by adjusting the material and the dimensions of the piezoelectric substrate, as well as the shape of the thinned-out electrodes and the dimensions of the fingers of the IDT. In short, the piezoelectric resonator 11 can be used effectively as a trap filter in the intermediate picture frequency section for a television receiver or a video tape recorder. In other words, it can be used as a single trap chip having two trap frequencies.

FIG. 8 shows another piezoelectric resonator 21 according to a second embodiment of the invention. It has an IDT 25 formed with two thinned-out comb-shaped electrodes 23 and 24. It is structured substantially in the same way as the first embodiment described above except in the manner in which the "thinning out" is carried out. In what follows, therefore, only the structure of the IDT 25 will be described, the components which are the same as in the first embodiment being indicated by the same numerals.

The electrodes 23 and 24 have two fingers 23a–23b and nine fingers 24a–24i, respectively, with a total of ten regions defined between mutually adjacent pairs of these fingers 23a, 23b and 24a –24i. The types of these regions are sequentially 0, 0, 0, 1, 1, 1, 1, 0, 0, 0 from one end to the other.

By designing the piezoelectric resonator 21 such that the frequency of the main lobe determined by the IDT 25 and the frequency determined by the distance between the two side edge surfaces 12a and 12b are farther separated, it was determined not only that there were two resonant frequencies but that their difference was 8.6 MHz. The difference between the two resonant frequencies can be adjusted by thinning out the fingers differently from the two comb-shaped electrodes 23 and 24 forming the IDT 25, although the difference between the two resonant frequencies cannot be uniquely determined because it depends not only on the manner in which fingers are thinned out from the comb-shaped electrodes but also on other factors such as the distance between the side edge surfaces 12a and 12b, the material of the piezoelectric substrate and the size of the fingers. It is possible, however, to adjust such factors appropriately according to the purpose for which the resonator is to be used.

FIG. 9 shows still another piezoelectric resonator 31 according to a third embodiment of the invention, also using a piezoelectric substrate 32 with a rectangular planar surface to form a surface wave resonator using BGS waves reflected at its side edge surfaces 32a and 32b. The piezoelectric substrate 32 is uniformly polarized in the direction of arrow P and a pair of comb-shaped electrodes 33 and 34 are formed on its rectangular planar surface as according to the first and second embodiments of the invention described above.

The third embodiment is distinguishable from the first and second embodiments of the invention in that neither of the pair of comb-shaped electrodes 33 and 34 has its fingers "thinned out", that the fingers of the two electrodes 33 and 34 are aligned and protrude directly towards each other and that the lengths of these fingers vary such that the lengths (in the direction of the fingers) of the regions each sandwiched between a mutually adjacent pair of fingers of the different electrodes 33 and 34 (where surface waves are adapted to be excited) vary in the direction of propagation of the surface waves. Piezoelectric resonators thus structured, too, have been found to have two resonant frequencies. It was ascertained that the difference between the two resonant frequencies could be about 9.2 MHz. The attenuation-frequency and impedance-frequency characteristics of a piezoelectric resonator according to the third embodiment of the invention was found to be similar to those shown in FIGS. 6 and 7.

Although this invention has been described above with reference to examples using BGS waves as an example SH type surface waves, it is not intended to limit the scope of the invention. Use may be made equally well of other SH type surface waves, such as Love waves, to obtain a resonator with a plurality of resonant frequencies by forming an IDT with thinned-out electrodes or by varying the length of the regions where surface waves are excited.

With a piezoelectric resonator as described above, attenuation at the adjacent-channel picture carrier frequency $f_{ap}$ and the adjacent-channel sound carrier frequency $f_{as}$ is respectively about 13 dB and 15 dB. The present invention further relates to trap circuits using piezoelectric resonators according to this invention and having improved attenuation capabilities.

FIG. 10 shows still another piezoelectric resonator 51 according to a fourth embodiment of the invention for forming a trap circuit with improved attenuation capability. Like the resonator described above with reference to FIGS. 4 and 5, this piezoelectric resonator 51 is also comprised of a rectangular piezoelectric substrate 52 of a piezoelectric material such as piezoelectric ceramics like lead zirconate titanate or piezoelectric single crystals of $LiNbO_3$ or $LiTaO_3$. If it is made of a piezoelectric ceramic material, it is polarized in the direction of arrow P. A pair of IDTs (herein referred to as "the first IDT 53" and "the second IDT 54") is formed on the upper surface of the piezoelectric substrate 52.

Each of them is comprised of a pair of comb-shaped electrodes having a plurality of fingers extending in the direction of P or opposite thereto. One of the pair of comb-shaped electrodes of the first IDT 53 is comprised of a plurality of fingers 53a and a first connector electrode 55 which is formed along one of the side edges of the piezoelectric substrate 52. The other of the pair of comb-shaped electrodes of the first IDT 53 is comprised of a plurality of fingers 53b all connected to a common connector electrode 56. Another plurality of fingers 54a protrude from the common connector electrode 56 in a direction away from the first connector electrode 55 and form, together with the central connector electrode 56, one of the pair of comb-shaped electrodes of the second IDT 54. The other of the pair of comb-shaped electrodes of the second IDT 54 is comprised of a plurality of fingers 54b all connected to a second connector electrode 57 which is formed along the side edge of the piezoelectric substrate 52 opposite the first connector electrode 55. These three connector electrodes 55, 56 and 57 are connected to terminals a, b and c, respectively, for application of voltages.

Although the fingers 53a, 53b, 54a and 54b forming the two IDTs 53 and 54 are only schematically drawn in FIG. 10, it is to be understood that the fingers for each IDT are formed as explained above for the first embodiment of the invention with reference to FIGS. 4 and 5. In other words, for example, the fingers 53a, 53b, 54a and 54b are each of width equal to λ/4 except that outermost ones of each of the IDTs 53 and 54 are of width equal to λ/8 and are arranged at a pitch of λ/4 on the piezoelectric substrate 52 where λ indicates the wavelength of the surface wave to be excited.

Each of the two resonant units formed by the two IDTs 53 and 54 functions like a piezoelectric resonator according to the first embodiment of the invention described above, having two resonance characteristics. In other words, it may be interpreted that resonators according to the fourth embodiment of the invention can be formed from a resonator according to the first embodiment of the invention by forming a central connector electrode 56 transversely to the fingers at the center. The lengths of the fingers in each IDT are adjusted such that the IDTs 53 and 54 will each have two resonance characteristics.

As shown in FIG. 11, a trap circuit for a television video receiver was formed by connecting the terminals a and c of FIG. 10 between an input terminal IN and an output terminal OUT and the terminal b to the ground. In FIG. 11, numerals 58 and 59 indicate resonant units formed by the two IDTs 53 and 54. Inserted between the aforementioned piezoelectric resonator 51 and the input terminal IN was a first resistor 61. Inserted between the ground potential and a point between the input terminal IN and the first resistor 61 was a second resistor 62. Inserted between the piezoelectric resonator 51 and the output terminal OUT was a third resistor 63. Inserted between the ground potential and a point between the output terminal OUT and the third resistor 63 was a fourth resistor 64. FIG. 12, which is a graph of the attenuation-frequency characteristic of a trap circuit thus structured, clearly shows that two traps were formed at two frequencies $f_{ap}$ and $f_{as}$ and that attenuation was as large as 15 dB and 17 dB at these frequencies. It is to be noted, however, that attenuation was undesirably large around the picture carrier frequency $f_p$ which, as shown in FIG. 12, is between the two trap frequencies $f_{ap}$ and $f_{as}$ and closer to the one at the higher frequency.

Next, an inductor 65 was inserted between the terminals a and c as shown by broken lines in FIG. 10 to form another trap circuit embodying the present invention, the terminal b being again connected to the ground potential as shown in FIG. 13. In other words, this trap circuit is identical to the one described above with reference to FIG. 11 except for the insertion of the inductor 65. Thus, the same symbols as used in FIG. 11 are used to indicate corresponding components of the trap circuit of FIG. 13. FIG. 14 is a graph of the attenuation-frequency characteristic of a trap circuit thus formed, showing that attenuation was respectively 22 dB and 27.5 dB at its two trap frequencies $f_{ap}$ and $f_{as}$. This clearly shows that insertion of the inductor 65 between the terminals a and c of the piezoelectric resonator 51 has the effect of increasing the attenuation at the adjacent-channel picture and sound frequencies by 9 dB and 12.5 dB. As can also be understood by comparing the graphs in FIGS. 12 and 14, furthermore, the insertion of the inductor 65 has the effect of reducing attenuation at the picture carrier frequency, or that of preventing it from becoming large at the picture carrier frequency.

Still another trap circuit was formed as shown in FIG. 15, which is different from the circuit shown in FIG. 13 in that another inductor 60 was inserted between the terminal a and the input terminal IN. FIG. 16 is a graph of the attenuation-frequency characteristic of a trap circuit thus formed, showing that attenuation was respectively 26 dB and 33 dB at its two trap frequencies $f_{ap}$ and $f_{as}$. This clearly shows that an insertion of the inductor 60 between the terminal a and the input terminal IN has the effect of further increasing the attenuation at the adjacent-channel picture and sound frequencies. Table 1 shows the magnitudes of attenuation by each of the three trap circuits described above (respectively with reference to FIGS. 10–12, 13–14 and 15–16) at the adjacent-channel picture and sound carrier frequencies $f_{ap}$ and $f_{as}$.

TABLE 1

|  | Attenuation at $f_{ap}$ (dB) | Attenuation at $f_{as}$ (dB) |
| --- | --- | --- |
| Circuit of FIG. 11 | 15 | 17 |
| Circuit of FIG. 13 | 22 | 27.5 |
| Circuit of FIG. 15 | 26 | 33 |

Although only three trap circuits have been shown above as embodying the present invention, these embodiments are not intended to limit the scope of the invention. Many modifications and variations are possible within the scope of this invention. For example, still another trap circuit was formed with an inductor (like the inductor 60 shown in FIG. 15) added between the terminal a and the input terminal IN of the circuit shown in FIG. 11 without any inductor (such as the inductor 65 shown in FIG. 13 or 15) inserted between the terminals a and c of the resonator 51, and it was discovered by using such a trap circuit that the attenuation was 21 dB and 24 dB at the adjacent-channel picture and sound carrier frequencies $f_{ap}$ and $f_{as}$, respectively.

As another example, two piezoelectric resonators, as shown for example in FIG. 4, may be used in the examples given above in place of the piezoelectric resonator 51 according to the fourth embodiment of the invention. In other words, two piezoelectric resonators 11 described above may be used to serve as the two resonant units 58 and 59 shown in FIGS. 11, 13 and 15, an inductor being connected therebetween (like the inductor 65 shown in FIGS. 13 and 15) and/or another like the inductor 60 shown in FIG. 15. Attenuation at the two trap frequencies can be thereby effectively improved in a similar manner. Although the use of a piezoelectric resonator according to the fourth embodiment of the invention is advantageous because the circuit structure can be thereby simplified because the resonant units are formed on a single chip, it is feasible according to the present invention to use two resonators using SH type surface waves in order to form a trap circuit with greater attenuation than was possible with prior art LC resonance circuits.

When two resonators are used in place of a single resonator 51 according to the fourth embodiment of the invention, as discussed above, these two resonators need not be resonators according to the first embodiment of the invention described above with reference to FIGS. 4 and 5. Still another trap circuit was formed, similar to the one described above with reference to FIG. 11 but using two resonators 31 according to the third embodiment of the invention to serve as the two resonant units 58 and 59 of FIG. 11, and it was discovered that the difference between the two resonant frequencies could also be increased to about 8 MHZ.

In summary, all such modifications and variations that may be apparent to a person skilled in the art are intended to be included within the scope of the invention.

What is claimed is:

1. A piezoelectric resonator comprising:
   a piezoelectric substrate; and
   an interdigital transducer which is formed on said substrate and has at least two resonance characteristics, said interdigital transducer comprising a pair of thinned-out comb-shaped electrodes each having a plurality of fingers protruding towards the other electrode, said fingers from said pair of electrodes being in mutually interlocking formation, at least one mutually adjacent pair of the fingers of one of said electrodes sandwiching therebetween two or more of the fingers of the other of said electrodes, said piezoelectric substrate and said interdigital transducer being capable of providing free-edge surface reflection.

2. The piezoelectric resonator of claim 1 wherein each of said fingers except those at both ends of said piezoelectric substrate have width equal to one-quarter of the wavelength of surface waves excited in regions between said fingers and mutually adjacent pairs of said fingers are separated by one-quarter of said wavelength.

3. The piezoelectric resonator of claim 1 comprising two interdigital transducers which are formed on said piezoelectric substrate and are connected to each other so as to form two resonant units each having two resonance characteristics.

4. A piezoelectric resonator comprising:

a piezoelectric substrate; and an interdigital transducer which is formed on said substrate and has at least two resonance characteristics, said interdigital transducer comprising a pair of comb-shaped electrodes each having a plurality of parallel fingers protruding in rows towards the other electrode, each of the fingers from one of the electrodes being aligned with one of the fingers from the other electrode, the lengths along said fingers of regions where surface waves can be excited upon application of a voltage across said electrodes varying over said rows, said piezoelectric substrate and said interdigital transducer being capable of providing free-edge surface reflection.

5. The piezoelectric resonator of claim 4 wherein each of said fingers except those at both ends of said piezoelectric substrate have width equal to one-quarter of the wavelength of surface waves excited in regions between said fingers and mutually adjacent pairs of said fingers are separated by one-quarter of said wavelength.

6. The piezoelectric resonator of claim 4 comprising two interdigital transducers which are formed on said piezoelectric substrate and are connected to each other so as to form two resonant units each having two resonance characteristics.

* * * * *